United States Patent
Beerhalter

(10) Patent No.: US 6,481,323 B1
(45) Date of Patent: Nov. 19, 2002

(54) STAMPING APPARATUS HAVING REPLACEABLE PUNCHES

(75) Inventor: Siegfried Beerhalter, Schwäbisch Gmünd (DE)

(73) Assignee: Groz-Beckert KG, Albstadt (DE)

( * ) Notice: Subject to any disclaimer, the term of this patent is extended or adjusted under 35 U.S.C. 154(b) by 0 days.

(21) Appl. No.: 09/450,700

(22) Filed: Nov. 30, 1999

(30) Foreign Application Priority Data

Dec. 2, 1998 (DE) .......................................... 198 55 578

(51) Int. Cl.[7] ................................................. B26D 5/02
(52) U.S. Cl. ............................. 83/563; 83/549; 83/687; 234/116; 234/118
(58) Field of Search ................................. 234/112, 114, 234/115, 116, 117, 118, 119, 98, 105, 111; 83/549, 552, 687, 691, 528, 563, 698.91

(56) References Cited

U.S. PATENT DOCUMENTS

| | | | | |
|---|---|---|---|---|
| 629,862 A | * | 8/1899 | Langjahr | |
| 732,279 A | * | 6/1903 | Davis | |
| 1,257,836 A | * | 2/1918 | Ferris | |
| 3,051,377 A | * | 8/1962 | Bradbury | |
| 3,059,844 A | * | 10/1962 | Englund | |
| 3,452,925 A | * | 7/1969 | Gettle et al. | |
| 4,235,089 A | * | 11/1980 | Vecchi | ......................... 72/325 |
| 4,480,782 A | * | 11/1984 | Morishima | |
| 4,685,613 A | | 8/1987 | Schambre | |
| 5,076,127 A | | 12/1991 | Otto et al. | |
| 5,090,284 A | | 2/1992 | Nakajima | |
| 5,144,872 A | * | 9/1992 | Kakimoto | |
| 5,214,991 A | | 6/1993 | Shimizu et al. | |
| 5,233,895 A | | 8/1993 | Coneski et al. | |

FOREIGN PATENT DOCUMENTS

| | | |
|---|---|---|
| EP | EP 0423052 A2 | 4/1991 |
| EP | EP 083537 A1 | 2/1994 |

* cited by examiner

Primary Examiner—Kenneth E. Peterson
(74) Attorney, Agent, or Firm—Venable; Norman N. Kunitz

(57) ABSTRACT

A stamping device includes a base body; an elongated punch having a longitudinal axis; a supporting arrangement for holding the punch in the base body and for guiding the punch for axial displacements between an advanced position and a retracted position; a driving unit releasably held in the base body and including a driving device for axially displacing the punch; a coupling device having a first state in which the coupling device operatively connects the driving device with the punch and a second state in which the driving device is disconnected from the punch; and a receiving arrangement for holding the punch in a desired axial position when the coupling device is in its second state.

13 Claims, 6 Drawing Sheets

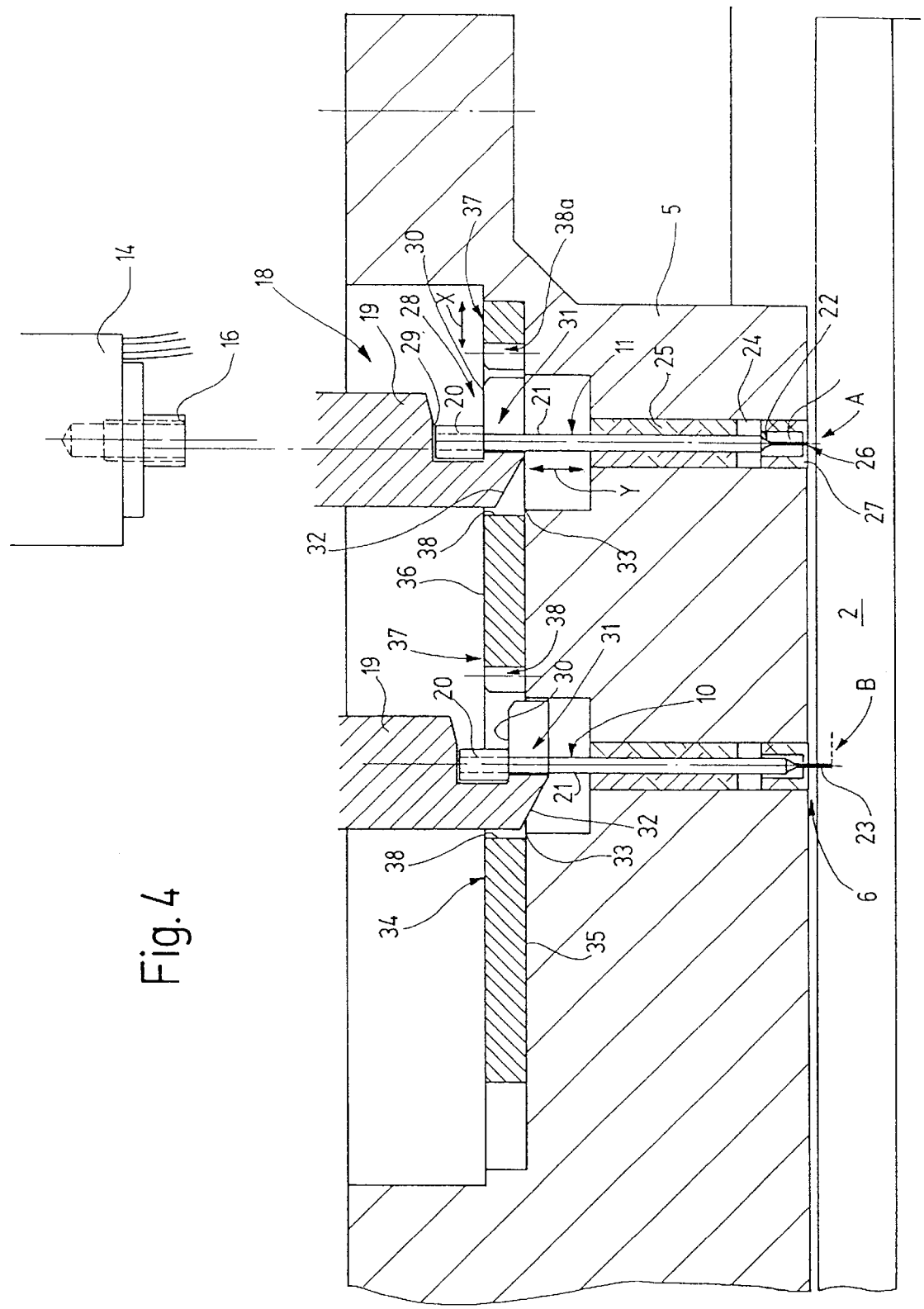

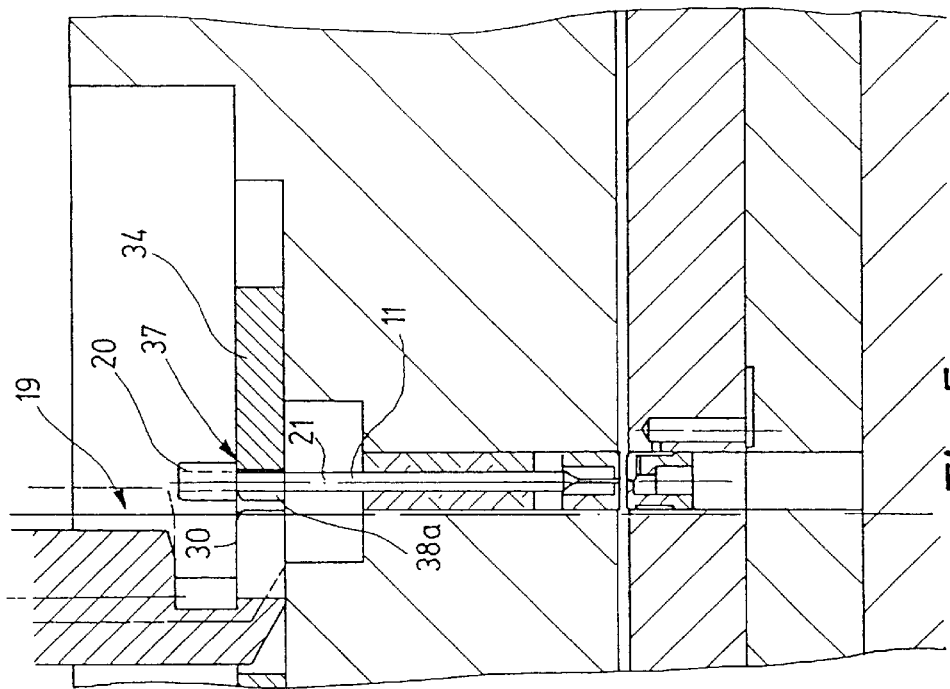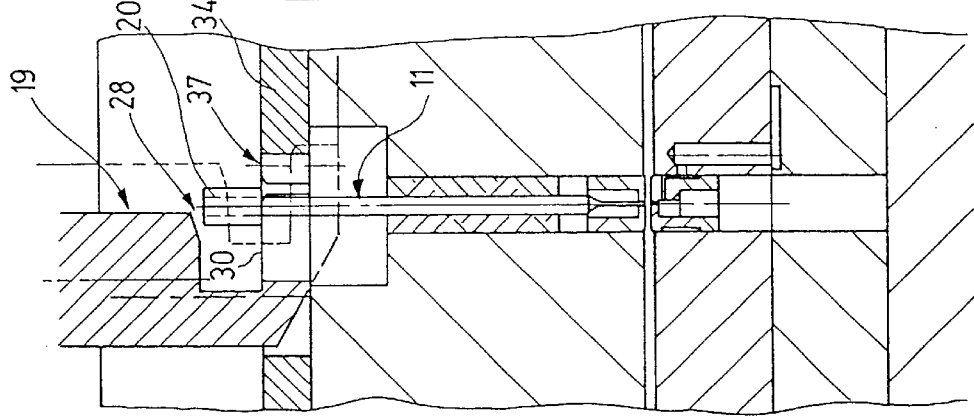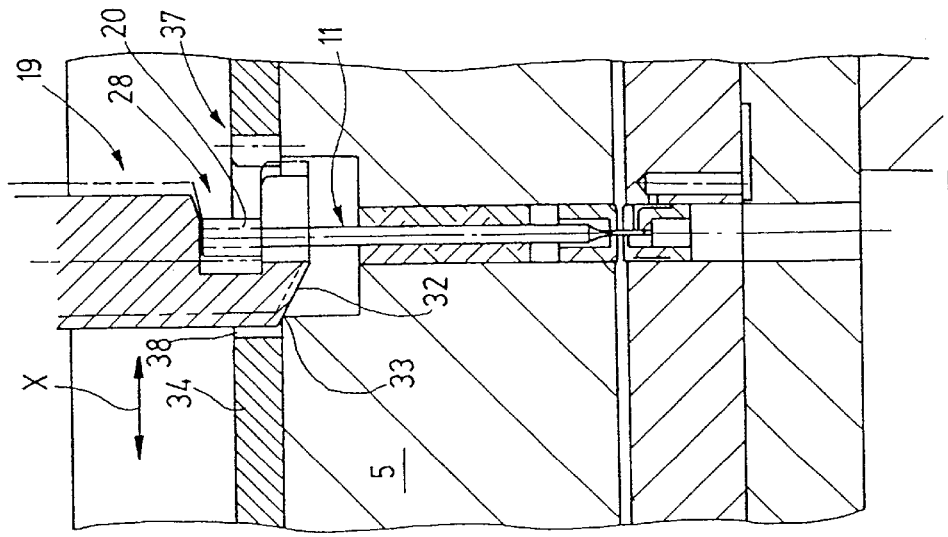

STAMPING APPARATUS HAVING REPLACEABLE PUNCHES

CROSS REFERENCE TO RELATED APPLICATION

This application claims the priority of German Application No. 198 55 578.4 filed Dec. 2, 1998, which is incorporated herein by reference.

BACKGROUND OF THE INVENTION

This invention relates to a stamping device particularly for providing holes in unfired ceramic substrates, also referred to hereafter as "green sheets".

In the manufacture of, for example, multilayer ceramic substrates used as circuit boards for supporting and electrically contacting electrical and electronic components, it is often required to provide a predetermined hole pattern in flat green sheets. The holes which may serve, for example, for a throughgoing contacting of printed circuit conductors, are provided by hole-stamping devices which, to ensure the required accuracy of the circuit board construction, are made with a tolerance of a few microns.

U.S. Pat. No. 5,233,895 discloses a stamping apparatus for stamping green sheets. The apparatus comprises an essentially stationary table on which the green sheet is positioned and on which it may be shifted as required. Above the table a base or carrier body is arranged which has a guiding device for an axially movable punch. The free end of the punch which serves as the stamping tool is axially displaceably supported in a throughgoing opening of an otherwise cup-shaped guide. In the table, facing the punch, an opening is provided into which the punch end may penetrate.

The punch is connected at its upper end with a cylindrical coil positioned in the annular gap of a permanent magnet arrangement in which a radial magnetic field is produced. An electrical energization of the coil thus results in an axial motion of the coil and the punch so that the latter may be moved into an advanced position and back into a retracted position.

The repeated stamping operations cause wear of the punches requiring their periodic replacement, either individually or as a group.

For performing such a replacement, U.S. Pat. No. 5,024,127 discloses the provision of a coupling device to releasably connect the electric drive arrangement and the stamping device formed by a punch. The punch is guided in a guiding device for axial displacements. The driving device has a plunger aligned with the punch and is movable by means of an electric drive connected with one end of the plunger. That end of the plunger which is oriented towards the punch and oriented away from the drive carries a coupling element which accommodates a head provided on the punch. For this purpose the coupling element defines a socket which, in the axial direction, is bordered by an engagement face for the frontal end of the punch and a second, split surface which is defined by a fork and which serves as an engagement face for the punch head. In case the driving device, the plunger and the coupling element are separated from the punch, the position of the punch is undefined. It may therefore move, for example, under its own weight, into a position which does not correspond to the position of disengagement. Such an occurrence may render the handling of the apparatus more difficult and may lead to problems particularly in case the punch has to be periodically replaced, for example, because of wear.

SUMMARY OF THE INVENTION

It is an object of the invention to provide an improved stamping device of the above-outlined type whose handling is rendered better compared to conventional devices, particularly in case of punch replacement.

This object and others to become apparent as the specification progresses, are accomplished by the invention, according to which, briefly stated, the stamping device includes a base body; an elongated punch having a longitudinal axis, a supporting arrangement for holding the punch in the base body and for guiding the punch for axial displacements between an advanced position and a retracted position; a driving unit releasably held in the base body and including a driving device for axially displacing the punch; a coupling device having a first state in which the coupling device operatively connects the driving device with the punch and a second state in which the driving device is disconnected from the punch; and a receiving arrangement for holding the punch in a desired axial position when the coupling device is in its second state.

Thus, the stamping device according to the invention has a base body on which one or a plurality of punches are axially shiftably supported between an advanced (stamping) position and a retracted position. The shifting of the punch is effected by a driving unit which has preferably a separate driving device for each punch. The driving devices are controlled by a control unit in such a manner that the punches may be shifted briefly into the stamping position to thus perform the stamping step. The transmission of the axial motion from the respective driving device to the associated punch is effected by a coupling device which may be disengaged when required. The coupling device provides for a fixed connection between the driving device and the respective punch in the axial direction and thus makes possible the axial transmission of motion, whereby the driving device determines the axial position of the punch. In case the driving device is separated (disconnected) from its associated punch, the axial position of the punch is no longer set by the driving device. For such a case, according to the invention, the receiving device serves to hold the punch in a desired axial position. The purpose of such a positioning is, for example, to prevent the punch from assuming unintentionally its advanced position in which its free end (stamping end) would project from its guide and from the base body and thus would be exposed to risks of being damaged. The receiving device sets the position of the respective punch at least to such an extent that its range of motion is significantly limited at least in one direction, while it may move freely in the opposite direction. Such an arrangement has, for example, the advantage that, after the driving unit has been removed, the punches may be taken out of their guide and may be replaced.

The receiving device which takes over the punch as long as the driving unit is disengaged, holds the punch in a predetermined position even when the driving unit is re-positioned or reconnected. Such steps may be particularly easily performed and thus a significantly simplified handling is achieved.

Preferably a plurality of identically structured punches are supported by the base body or, more precisely, by a guiding device supported on the base body, in such a manner that the punches are displaceable axially independently from and parallel to one another, provided they are released by the receiving device. In case the punches are received by the receiving device, they are all held in a predetermined position, preferably in the retracted position.

According to a preferred embodiment of the invention, the punches are each formed by a cylindrical shank adjoined, as the stamping tool, by a cylindrical stamping portion, whose diameter is significantly less than the diameter of the shank. The shank is supported in a guide, such as a guide sleeve. The stamping portion passes through an opening of a cup-shaped guiding or stripping element. In the withdrawn position the stamping portion does not project beyond the guiding and stripping element; the frontal end of the stamping portion is positioned within an opening provided in the guiding and stripping element. The shank and the stamping portion are preferably in a coaxial alignment with one another. The guide sleeve guides the shank during introduction of the punch with such an accuracy that the stamping portion penetrates into the opening of the guiding and stripping element without contacting or colliding with the latter.

At its end remote from the stamping element, the punch preferably has a head which, together with the coupling element associated therewith, forms the coupling device for coupling the punch to the driving device. The coupling element connects the punch in a form-fitting (form-locking) manner; for this purpose the coupling element has a laterally open socket for the punch head. The socket is bordered by two facing surfaces between which the head of the punch passes with a very small clearance or with practically no clearance. For uncoupling the driving device from the punch, the punch is laterally displaced relative to the driving device, so that the punch head may move out laterally from the socket. The coupling elements of all the driving devices or at least of one group of the driving devices are identically oriented so that the coupling and uncoupling of the coupling devices may be effected by a lateral displacement of the entire driving unit or a determined group of driving devices. As a result, it is, for example, feasible to remove a driving unit from the stamping device, whereby the punches separately driven by the respective driving unit are individually accessible and replaceable, if required.

As a receiving device for the punch heads a head plate is provided which is positioned between the driving unit and the guiding devices for the punches. The guiding devices are provided on the base body and are formed, for example, by guide sleeves. The head plate is thus situated in the vicinity of that end of the respective punch which is oriented towards the respective driving device and is thus in the vicinity of the coupling device. In such a position the head plate may take over the punches and/or their heads when they are released by the coupling elements. As the driving unit is disconnected from the punches, the latter are received by the head plate so that the punches may not move in an uncontrolled manner into an undesired position, for example, into an advanced (stamping) position.

For receiving the punch heads, a special engagement zone (punch head supporting surface region) is provided on the head plate preferably for each punch. The engagement zone is shifted underneath the punch head before the latter may entirely move out of the coupling element. Advantageously, the engagement zone formed on the head plate lies at the same level as the corresponding engagement face on the coupling element, that is, it is situated coplanar therewith, when the coupling element is in the retracted position.

In order to hold the coupling element positively in the retracted position during uncoupling, the coupling element preferably has an end face which, when the coupling element is in the retracted position, is situated at the same level as a supporting surface provided at the underside of the head plate. As result, during uncoupling, the coupling element is in a firm engagement, for example, with the base body or a counter support and is thus positively maintained in a position in which a transfer of the punch head from the socket to the head plate is feasible.

On the coupling element a positioning surface may be provided which adjoins the lower end face of the coupling element and which serves to guide the coupling element into a replacement position in which the punch head may be transferred to the head plate. Such a replacement position is preferably the position which determines the retracted position of the punch. The positioning surface may be formed, for example, by an oblique run-on face which may cooperate with a stationary edge (counter support) formed, for example, on the base body.

BRIEF DESCRIPTION OF THE DRAWINGS

FIG. 4 is a fragmentary sectional side elevational view of the stamping device shown in FIGS. 1–3, shown at an enlarged scale.

FIGS. 5a, 5b and 5c are views similar to FIG. 4, illustrating three different operational positions of the stamping device.

DESCRIPTION OF THE PREFERRED EMBODIMENT

Figure 1:
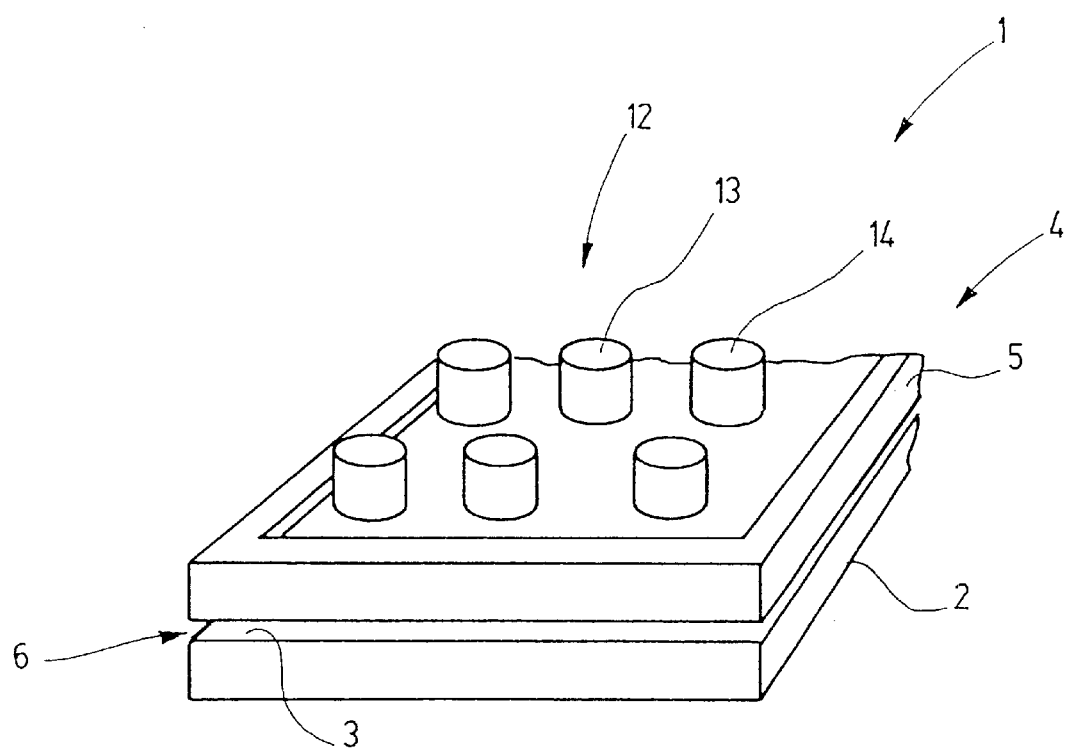
FIG. 1 is a schematic perspective view of the stamping device according to the invention.

FIG. 1 illustrates a stamping device 1 by means of which a predetermined or selectable hole pattern is to be provided in a flat substrate, particularly unfired ceramic layers (green sheets) which find application in the manufacture of ceramic substrates for electronic components or component groups. The stamping device includes a table 2 which has an essentially planar upper side 3 on which a green sheet to be provided with holes is positioned. Means for positioning the green sheet on the table 2 and for moving (shifting) the same are not illustrated in further detail.

Above the table 2 a stamping head 4 is disposed which comprises an essentially flat base body 5 which defines a clearance 6 with the table 2 for the introduction and passage of the green sheet. The base body 5 is, by means not illustrated in detail, disposed in a predetermined position relative to the table 2. If required, the base body 5 may be moved in such a manner towards or away from the table 2 that the clearance 6 is widened or narrowed. During operation, particularly for performing the stamping steps, the stamping head 4, however, remains stationary, as may be seen in FIG. 2. As further illustrated in FIG. 2, underneath the table 2 a receiving space 7 for the stamping waste and a corresponding removal device are arranged. The table 2 is surrounded by a frame 8 provided at its upper side with an opening 9 into which one part of the base body 5 of the stamping head 4 may penetrate.

Figure 2:
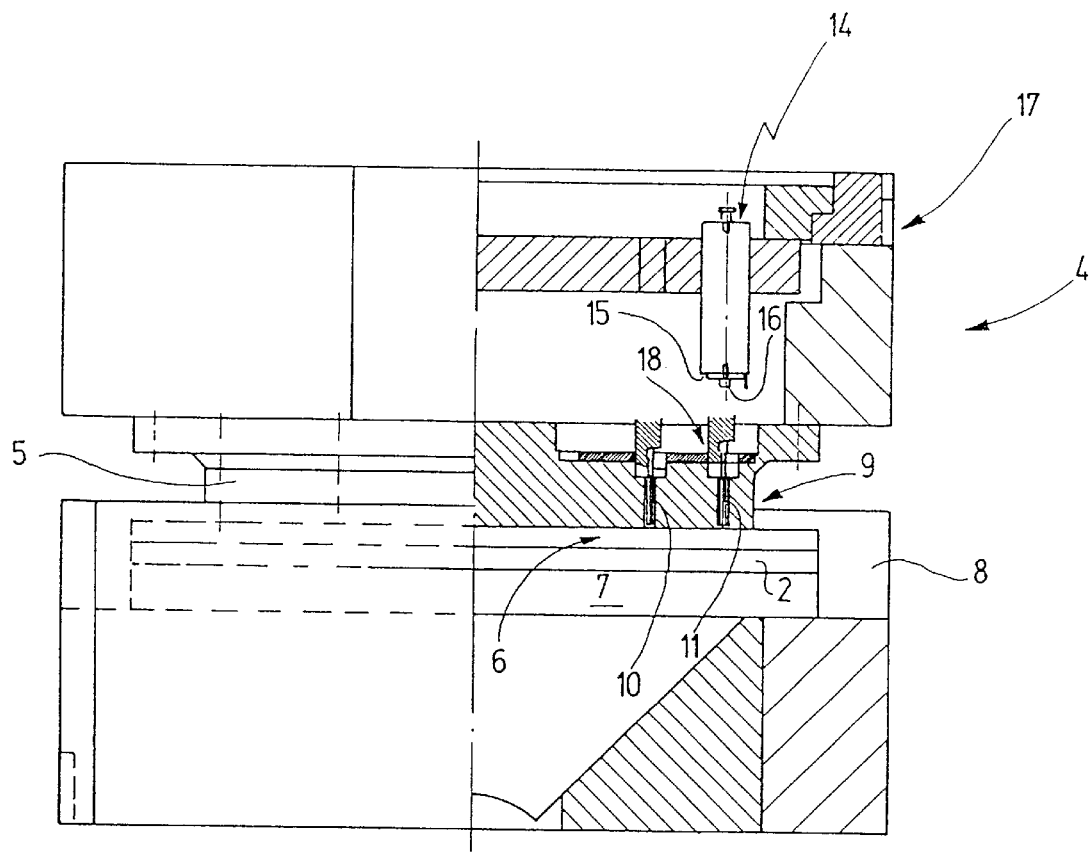
FIG. 2 is a schematic, partially sectional side elevational view of a preferred embodiment of the stamping device according to the invention.

For stamping the green sheet or other flat material introduced into the clearance 6, individual punches, of which only two are shown at 10 and 11, are mounted on the stamping head 4. The punches may be displaced in such a manner that their free ends move out of the base body 5, they traverse the clearance 6 and penetrate into a respective aligned opening provided in the table 2. The punches 10 and 11 may be operated independently and separately from one another. For driving the punches, a driving unit 12 is provided which is composed of a plurality of individual electric driving devices, of which two are shown at 13 and 14. Preferably each punch 10 and 11 has its own, independently operable driving device as shown in FIG. 2 symbolically at 14 for the punch 11.

The driving device 14 is formed of a separately controlled magnetic or electromagnetic drive not illustrated in detail. Upon actuation of the driving device 14, a shank or plunger 16 projecting from its underside 15 is moved downwardly through a predetermined distance. The driving device 14 is, similarly to the other driving devices, connected with the base body 5 by a respective carrier element 17 and supported in such a manner that the plunger 16 is in alignment with the punch 11.

Turning to FIG. 4, a coupling device 18 which connects the plunger 16 with the punch 11, includes a coupling element 19 and a head 20 mounted on the punch 11. The head 20 of the punch 11 is formed by a cylindrical part which has a greater diameter than that of a cylindrical shank portion 21 of the punch 11 adjoining directly the head 20. The lower end of the shank portion 21 has a transitional region 22 which is adjoined by a cylindrical stamping portion 23. The shank portion 21 serves for supporting and guiding the punch 11 in the base body 5. For this purpose the base body 5 has a throughgoing bore 24 which is arranged coaxially with the punch 11 and in which a guide sleeve 25 is arranged to cooperate with the punch 11 by axially guiding the shank portion 21 and thus the punch 11 with a minimum clearance.

The stamping portion 23 projects into a throughgoing opening 26 of a guiding and stripping element 27 which is seated in the bore 24 at the underside of the base body 5. The punch 11 is in a retracted position A if the stamping portion 23 does not project from the opening 26. For performing a stamping operation, the punch 11, as shown for the punch 10 in FIG. 4, is axially displaced so that the stamping portion 23 moves out of the throughgoing opening 26 and, after traversing the clearance 6, penetrates into a corresponding bore provided in the table 2, whereby the punch 10 assumes an advanced position B (stamping position).

The coupling element 19 forming part of the coupling device 18 and carried by the plunger 16 has a socket 28 for receiving the cylindrical head 20 formed on or soldered to the shank portion 21 of the punch 11. The socket 28 is open transversely to the punch 11, that is, in a lateral direction X. Further, relative to the longitudinal direction of the punch 11 which coincides with its direction of motion Y, the socket 28 is bordered by a planar face 29 and a planar supporting face 30 which is parallel to the face 29. The distance between the two faces 29 and 30 is only slightly larger than the axial length of the punch head 20, whereby the latter is received with a minimal clearance in the socket 28.

That portion of the coupling element 19 which reaches underneath the punch head 20 and on which the supporting face 30 is formed, is of forked construction, that is, it is provided, in the X direction, with a laterally-oriented opening 31 through which the shank portion 21 of the punch 11 may extend. The width of the opening 31 is less than the diameter of the punch head 20 so that the latter may not slip through the opening 31.

To facilitate an introduction of the punch head 20 into the socket 28, its faces 29 and 30 are provided with a respective lead-in chamfer at their end oriented away from the head 20 as viewed in the transverse direction X.

As it may also be observed in FIG. 4, the coupling element 19 is provided with a chamfered surface 32 at its end oriented away from the driving device 14. The chamfered surface 32 serves as a positioning face which, in cooperation with a stationary edge 33 provided on the base body 5, constitutes a positioning device for axially guiding the coupling element 19 into an upper position in which the punch 11 is in its retracted position A. The edge 33 acts as a counter support for the inclined (chamfered) surface 32. Thus the cooperation between the two components 32 and 33 result in a camming action causing the coupling element 19 to move axially together with the punch 11.

Figure 3:
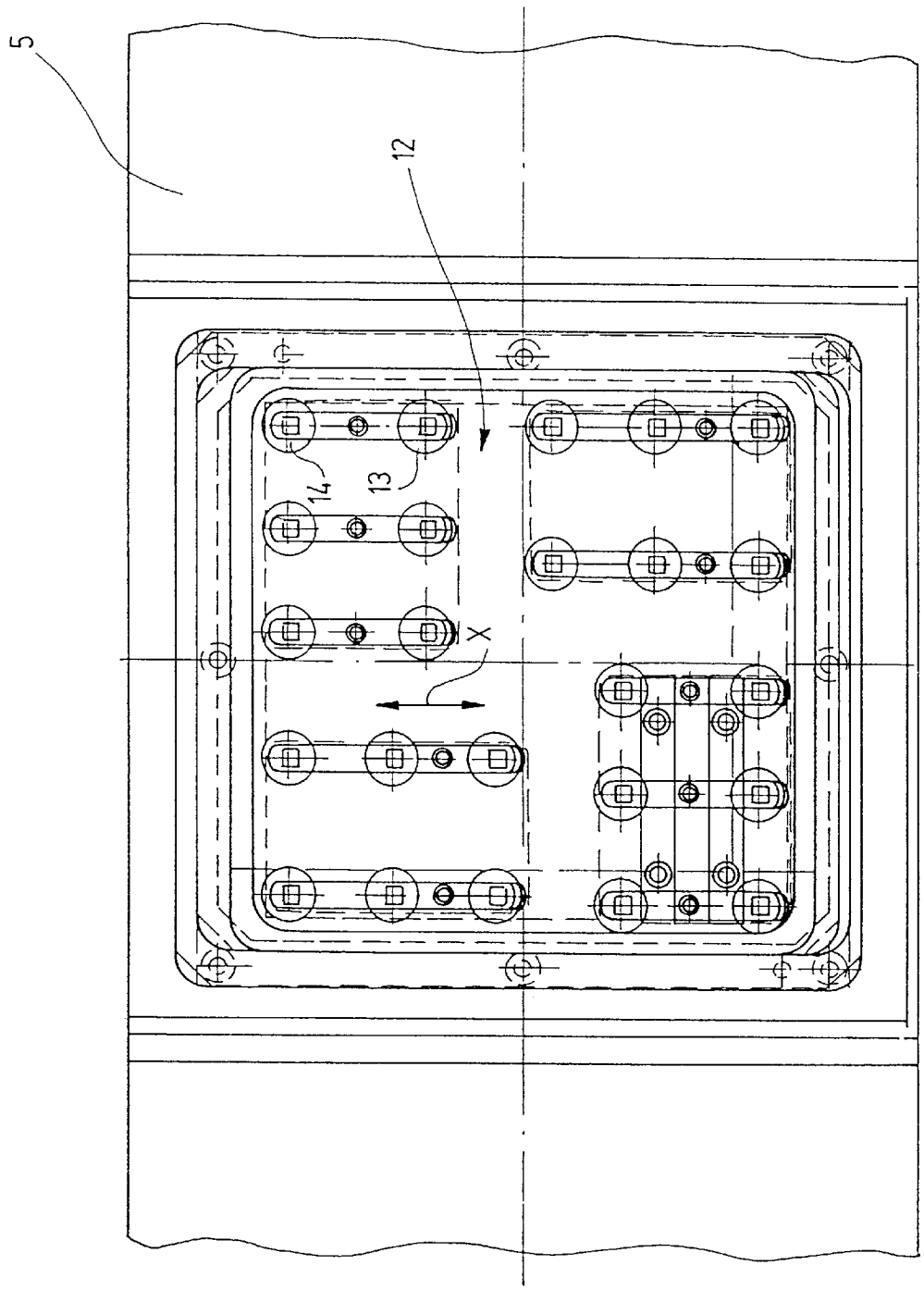
FIG. 3 is a top plan view of the stamping device shown in FIGS. 1 and 2.

All the punches (of which only punches 10 and 11 are described and shown in FIGS. 2 and 4), are of identical construction. The guide sleeves 25 for guiding and supporting the punches, the guiding and stripping devices 27, the coupling devices 18 and the driving devices (of which only the driving device 14 is shown in FIGS. 2 and 4) are likewise of identical structure, so that the foregoing description of the punch 11 and the components cooperating therewith apply equally to all other punches and the components as well as elements cooperating therewith. The punches and the driving devices may be arranged in groups as shown in FIG. 3. The entire driving unit 12 composed of all the driving devices is supported such that it may be shifted in the X direction so that all coupling elements 19 may be moved into and out of engagement with the respective punch heads 20. All the punches are preferably moved back into their retracted position A and maintained there when they are situated in that position. In particular, an unintentional shifting of the punches into their stamping position B has to be prevented in case the driving unit is disconnected from the punches.

For preventing such an unintentional shift of the punches, a movable head plate 34 is provided as shown in FIG. 4. The movable head plate is mounted on a slide face 35 of the base body 5 to be shiftable in the X direction. On its upper face 36 the head plate 34 has for each punch a respective supporting region 37 which lies in a common plane with the supporting face 30 of the socket 28 of the coupling elements 19 when the latter are in a position which defines the retracted position A of the punches. The head plate 34 has for each punch an aperture 38 through which the respective coupling element 19 may pass and which adjoins the supporting region 37.

On its side oriented towards the coupling element 19, the supporting region 37 changes into a lead-in chamfer. At the edge of the aperture 38 an enlargement (bay) 38a is provided which is adapted to receive the shank portion 21 of the respective punch when the head plate 34 is shifted underneath the respective punch head 20. The bay 38a faces the open end of the opening 31 of the coupling element 19 and is disposed essentially as a linear continuation thereof. For receiving the punch heads 20, the head plate 34 is shiftable in the X direction and the length of the displacement path of the head plate 34 is so dimensioned that the punch heads 20 are transferred from the coupling elements 19 to the head plate 34 when the driving unit 12, together with the head plate 34, is shifted in the X direction for disconnecting the driving unit 12 from the punches. The head plate 34 is preferably connected with an arresting device which allows a displacement thereof only together with the driving unit 12. Therefore, when the driving unit 12 is removed, the head plate 34 is immobilized.

The thickness of the head plate 34 preferably equals the thickness of that part of the coupling element 19 which extends underneath the respective punch head 20. Such a thickness is the distance between the supporting face 30 of the socket 28 and that end face of the forked part of the coupling element 19 which lies on the opposite side from the supporting face 30. Such an arrangement ensures that the supporting face 30 and the supporting surface region 37 of the head plate 34 lie in a common plane when the driving unit 12 is disconnected from the punches (such as the punches 10 and 11) by a lateral displacement of the driving unit 12 from the punches. During this occurrence the coupling elements 19 arrive in engagement with that region of the slide face 35 which immediately adjoins the respective edge 33 of the base body 5, thus fixing the position of the coupling elements 19.

In the description which follows, the punch replacement in the above-described stamping apparatus 1 will be set forth.

Figure 6:
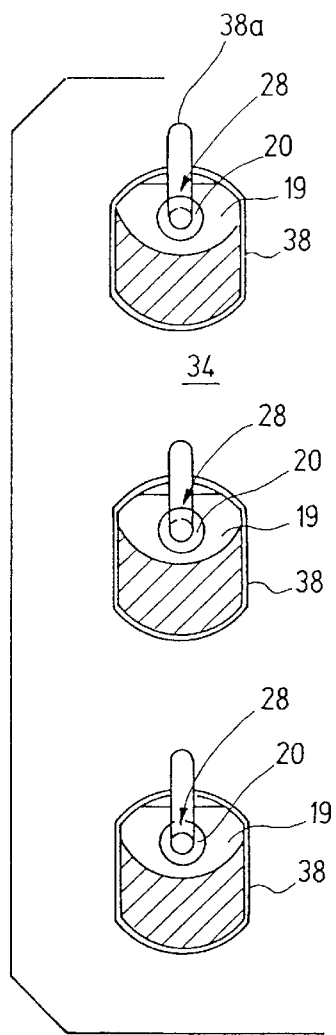
FIG. 6 is a schematic sectional top plan view of the driving devices with coupled punches.

It is initially assumed that the stamping device 1 is in a state illustrated in FIGS. 4 and 6. All driving devices are connected with the respective associated punches. The punch heads 20 are situated completely in the respective sockets 28 of the coupling elements 19.

It is now assumed that a punch replacement is to be performed.

Figure 7:
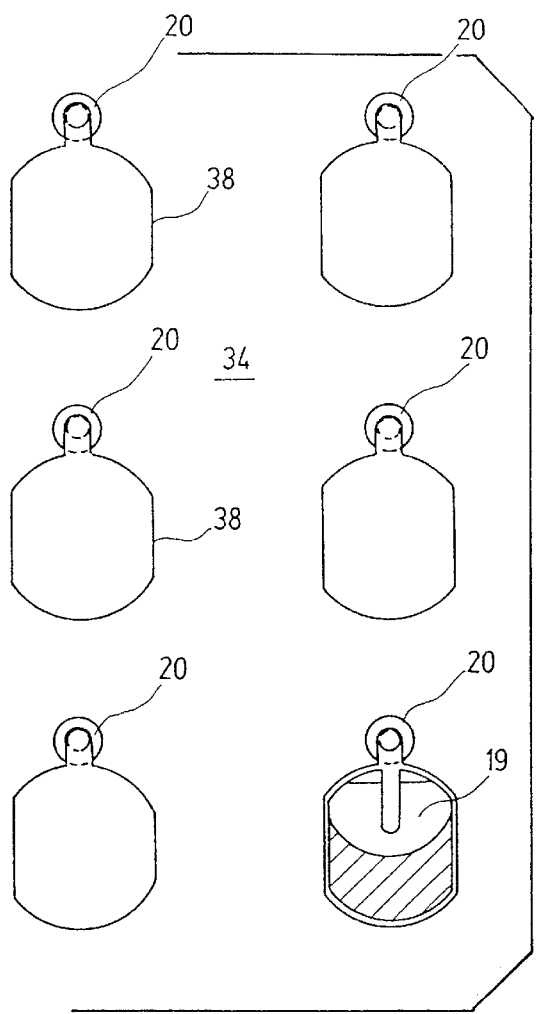
FIG. 7 is a view similar to FIG. 6 illustrating the driving devices separated from the punches.

As illustrated in FIG. 5a for the punch 11, for a punch replacement the driving unit 12 with the associated coupling element 19 and the head plate 34 are displaced in such a manner that the punch head 20 begins to laterally move out of the socket 28. In case the coupling element 19 is not in the position which corresponds to the retracted position A, the chamfered face 32 of the coupling element 19 runs up on the edge 33 of the base body 5. Upon further displacement of the coupling element 19 in the X direction as seen, for example, in FIG. 5b, the coupling element 19 is axially pressed progressively toward the driving device until the punch 11 arrives in its retracted position A. During this occurrence the punch head 20 slides out of the socket 28. Because of the small distance between the free ends of that part of the coupling element 19 which reaches underneath the head 20 and the adjoining edge of the aperture 38 which surrounds the coupling element 19, the punch head 20 glides on the supporting surface region 37 before it entirely leaves the coupling element 19. The distance between the edge of the aperture 38 and the end of the supporting face 30 is less than the diameter of the punch head 20. When the coupling element 19 has entirely released the punch head 20, the head plate 34 is shifted underneath the punch head 20 so that the shank portion 21 of the punch 11 enters the bay 38a. Such a position is shown in the side view of FIG. 5c and in the top plan view of FIG. 7. The heads 20 of all punches are now carried by the head plate 34. The driving.devices may be removed individually or in groups to thus gain access to the punches which may be replaced individually or in groups.

During the re-connection of the driving devices which takes place in a reverse order, all coupling elements 19 find the punch heads 20 in the correct position. The punch heads 20 are situated immediately next to the respective socket 28 without a height offset. A re-connection may be carried out with ease and without exposing the punch heads 20 to lateral forces.

It will be understood that the above description of the present invention is susceptible to various modifications, changes and adaptations, and the same are intended to be comprehended within the meaning and range of equivalents of the appended claims.

What is claimed is:

1. A stamping device comprising
   (a) a base body;
   (b) an elongated punch having a longitudinal axis;
   (c) supporting means for holding said punch in said base body and for guiding said punch for axial displacements between an advanced position and a retracted position;
   (d) a driving unit held in said base body and including a driving device for axially displacing said punch; said driving device having a first position in which said driving device is installed in said base body and a second position in which said driving device is removed from said base body, allowing access to said punch remaining in said base body;
   (e) a coupling device having a first state in which the coupling device operatively connects said driving device with said punch and a second state in which said driving device is disconnected from said punch;
   (f) receiving means for holding said punch in a desired, retracted axial position when said coupling device is in said second state; and
   (g) means for simultaneously moving said coupling device away from said punch transversely to the longitudinal punch axis to place said coupling device from said first state into said second state and said receiving means transversely to the longitudinal punch axis into a holding engagement with said punch for holding said punch in said desired, retracted axial position as said coupling device assumes said second state; said receiving means being in said holding engagement with said punch when said driving device is in its said second position, allowing access to said punch remaining in said base body.

2. The stamping device as defined in claim 1, wherein said punch comprises
   (a) a cylindrical shank portion having a first diameter;
   (b) a stamping portion having a second diameter smaller than said first diameter; and
   (c) a transitional portion connecting said shank portion with said stamping portion; and
further wherein said supporting means comprises
   (a) a guiding and stripping element disposed in said base body for supporting said stamping portion of said punch; and
   (b) a guide sleeve in said base body for supporting said shank portion; said punch being removable from said supporting means in said second state of said coupling device.

3. A stamping device comprising
   (a) a base body;
   (b) an elongated punch having a longitudinal axis and a punch head;
   (c) supporting means for holding said punch in said base body and for guiding said punch for axial displacements between an advanced position and a retracted position;
   (d) a driving unit held in said base body and including a driving device for axially displacing said punch;

(e) a coupling device having a first state in which the coupling device operatively connects said driving device with said punch and a second state in which said driving device is disconnected from said punch; said coupling device having a coupling element provided with a socket to accommodate said punch head for connecting said punch with said driving device in said first state of said coupling device and (f) receiving means for holding said punch in a desired axial position when said coupling device is in said second state; said receiving means comprising a head plate supported on said base body for shifting motions parallel to said transverse direction; said head plate having
  (1) an aperture through which said coupling element passes; and
  (2) fixing means for immobilizing said punch in said second state of said coupling device.

4. A stamping device comprising (a) a base body;

(b) an elongated punch having a longitudinal axis;

(c) supporting means for holding said punch in said base body and for guiding said punch for axial displacements between an advanced position and a retracted position;

(d) a driving unit held in said base body and including a driving device for axially displacing said punch; said driving device having a first position in which said driving device is installed in said base body and a second position in which said driving device is removed from said base body, allowing access to said punch remaining in said base body;

(e) a coupling device having a first state and a second state; in said first state said coupling device being in alignment with said driving device and said punch for transmitting axial displacements of said driving device to said punch; and in said second state said coupling device being out of alignment with said punch for disconnecting said driving device from said punch for preventing axial displacements of said driving device from being transmitted to said punch;

(f) receiving means for holding said punch in a desired, retracted axial position when said coupling device is in said second state; and (g) means for simultaneously moving said coupling device away from said punch transversely to the longitudinal punch axis to place said coupling device from said first state into said second state and said receiving means transversely to the longitudinal punch axis into a holding engagement with said punch for holding said punch in said desired, retracted axial position as said coupling device assumes said second state.

5. A stamping device comprising (a) a base body;

(b) an elongated punch having a punch head and a longitudinal axis; said punch including a cylindrical shank portion having a diameter less than a diameter of said punch head;

(c) supporting means for holding said punch in said base body and for guiding said punch for axial displacements between an advanced position and a retracted position;

(d) a driving unit held in said base body and including a driving device for axially displacing said punch;

(e) a coupling device having a first state in which the coupling device operatively connects said driving device with said punch and a second state in which said driving device is disconnected from said punch; said coupling device having a coupling element provided with a socket to accommodate said punch head for connecting said punch with said driving device in said first state of said coupling device; said socket having an opening oriented in a direction transverse to said longitudinal axis of said punch; said opening being dimensioned such that said punch head may enter into and exit from said socket in the transverse direction; said socket having a planar supporting face arranged to engage face-to-face an underside of said punch head; said coupling element having a forked portion adjoining said socket and defining a slot-shaped opening oriented in said transverse direction and interrupting said supporting face of said socket; said slot-shaped opening being dimensioned such that said shank portion of said punch may enter into and exit from said forked portion in the transverse direction;

(f) means for moving said coupling element and said driving device in unison parallel to said transverse direction relative to said punch for selectively placing said coupling device into one of said first and second states; and (g) receiving means for holding said punch in a desired axial position when said coupling device is in said second state; said receiving means comprising a head plate supported on said base body for shifting motions parallel to said transverse direction; said head plate having
  (1) an aperture through which said coupling element passes; and
  (2) fixing means for immobilizing said punch in said second state of said coupling device.

6. The stamping device as defined in claim 5, wherein said head plate further comprises an upper face being coplanar with said supporting surface of said socket when said coupling element is in an axial position in which said coupling element holds said punch in the retracted position thereof.

7. The stamping device as defined in claim 5, further wherein said fixing means comprises
  (a) a bay forming a continuation of said aperture of said head plate and being dimensioned for allowing said punch to pass from said aperture into said bay; and
  (b) a supporting surface region located on an upper face of said head plate for holding said punch at said underside of said punch head when said punch is accommodated in said bay; said supporting surface region bounding said bay.

8. The stamping device as defined in claim 5, wherein said head plate further comprises an upper face and an underface opposite said upper face and said coupling element has a lower end face remote from said driving device; said underface of said head plate and said lower end face of said coupling element being in a coplanar relationship when said coupling element is in an axial position in which said coupling element holds said punch in said retracted position.

9. The stamping device as defined in claim 8, further comprising a positioning surface forming part of said coupling element and adjoining said lower end face of said coupling element; and means cooperating with said positioning surface for axially moving said coupling element during displacement of said coupling element relative to said base body parallel to said transverse direction until said lower end face of said coupling element arrives in a coplanar relationship with said underface of said head plate.

10. The stamping device as defined in claim 9, wherein said positioning surface is a run-on face oriented obliquely to said lower end face of said coupling element.

11. The stamping device as defined in claim 10, wherein said means cooperating with said positioning surface is positioned on said base body.

12. The stamping device as defined in claim 11, wherein said means cooperating with said positioning surface is an edge formed on said base body; said edge being arranged to slide on said run-on face for axially displacing said coupling element by a camming action between said run-on face and said edge.

13. The stamping device as defined in claim 12, further comprising means for moving said head plate together with said driving device parallel to said transverse direction.

* * * * *